United States Patent
Lu et al.

(10) Patent No.: US 9,425,755 B1
(45) Date of Patent: Aug. 23, 2016

(54) SWING LIMITER CIRCUIT

(71) Applicant: QUALCOMM Incorporated, San Diego, CA (US)

(72) Inventors: Jingxue Lu, San Diego, CA (US); Chenling Huang, Fremont, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/812,054

(22) Filed: Jul. 29, 2015

(51) Int. Cl.
*H05K 1/18* (2006.01)
*H03F 3/45* (2006.01)
*H03F 3/217* (2006.01)

(52) U.S. Cl.
CPC .......... *H03F 3/45668* (2013.01); *H03F 3/2171* (2013.01); *H03F 3/45497* (2013.01); *H03F 3/45816* (2013.01); *H03F 2203/45151* (2013.01)

(58) Field of Classification Search
CPC ..................................................... H03F 3/217
USPC ............................... 331/10; 381/120; 332/109
See application file for complete search history.

(56) References Cited

U.S. PATENT DOCUMENTS

| | | | |
|---|---|---|---|
| 5,642,076 A | 6/1997 | Naokawa et al. | |
| 7,262,658 B2 | 8/2007 | Ramaswamy et al. | |
| 7,339,425 B2 | 3/2008 | Yang et al. | |
| 8,536,938 B2 | 9/2013 | Walker et al. | |
| 2005/0242874 A1* | 11/2005 | Lind | H03F 3/217 330/10 |
| 2014/0084999 A1 | 3/2014 | Wan | |
| 2014/0355790 A1* | 12/2014 | Panov | H03F 3/217 381/120 |

* cited by examiner

*Primary Examiner* — Joseph Chang
(74) *Attorney, Agent, or Firm* — Paradice and Li LLP (57) ABSTRACT

A differential class-D amplifier module having common-mode swing limiter circuit is disclosed. The differential class-D amplifier module may include differential class-D amplifier configured to generate differential pulse width modulated (PWM) output signals based on differential input signals and at least a portion of the differential PWM output signals that are fed back to the differential class-D amplifier. The common-mode swing limiter circuit may attenuate one or more common-mode signal components associated with the PWM output signals that may be fed back to input terminals of the differential class-D amplifier.

20 Claims, 9 Drawing Sheets

SWING LIMITER CIRCUIT

TECHNICAL FIELD

The exemplary embodiments relate generally to circuits that generate differential pulse width modulated signals, and specifically to circuits to limit a common-mode swing of differential pulse width modulated signals.

BACKGROUND OF RELATED ART

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to generate a modulated RF signal, amplify the modulated RF signal to generate a transmit RF signal having the proper output power level, and transmit the transmit RF signal via an antenna to another device such as, for example, a base station. For data reception, the receiver may obtain a received RF signal via the antenna and may amplify and process the received RF signal to recover data sent by the other device.

The wireless device may transmit and receive communication data through a communication medium. In one example, the communication medium may be a wireless communication medium where communication data is transmitted and received by communication devices according to a wireless communication protocol. Example wireless communication protocols may include IEEE 802.11 protocols (e.g., Wi-Fi) and BLUETOOTH® protocols according to the Bluetooth Special Interest Group. Moreover, example wireless communication protocols may further include Long Term Evolution or LTE. LTE is a set of enhancements to the Universal Mobile Telecommunications System (UMTS) mobile standard promulgated by Third Generation Partnership Project (3GPP). In some examples, LTE provides over-the-air wireless communication of high-speed data for mobile phones and data terminals.

Analog signals within a wireless device may undergo amplification during various processing operations. Thus, amplifiers may be included within the wireless device to provide signal amplification. Different types of amplifiers may be available for different uses. For example, a wireless device such as a cellular phone may include a transmitter and a receiver for bi-directional communication. The transmitter may use a driver amplifier (DA) and a power amplifier (PA), the receiver may use a low noise amplifier (LNA), and the transmitter and receiver may both use variable gain amplifiers (VGAs).

Various classes of amplifiers may be used to implement the different types of amplifiers. A "class-D" amplifier, for example, may provide relatively power efficient operation by producing pulse width modulated (PWM) output signals. The PWM output signals may be generated by operating output transistors of the class-D amplifier as switches rather than operating them as linear gain devices. Operating the output transistors as switches may consume less power than operating the output transistors as linear gain devices.

Some class-D amplifiers may be differential class-D amplifiers designed to receive and amplify differential input signals and generate associated differential PWM output signals. Some differential class-D amplifiers may feedback a portion of the differential PWM output signals (e.g., the differential PWM output signals may be partially fed back) to be summed with the differential input signals. The feedback signal may control, at least in part, a frequency response associated with the differential class-D amplifier. The switched nature of the differential PWM output signals may cause an associated common-mode voltage to rise and/or fall uncontrollably. Relatively high common-mode voltages may stress one or more components within the differential class-D amplifier and may increase distortion associated with the differential input signal.

Thus, there is a need to control the common-mode voltage associated with the inputs of differential class-D amplifiers.

BRIEF DESCRIPTION OF THE DRAWINGS

The exemplary embodiments are illustrated by way of example and are not intended to be limited by the figures of the accompanying drawings. Like numbers reference like elements throughout the drawings and specification.

DETAILED DESCRIPTION

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of exemplary embodiments. However, it will be apparent to one skilled in the art that these specific details may not be required to practice the exemplary embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The exemplary embodiments are not to be construed as limited to specific examples described herein but rather to include within their scope all exemplary embodiments defined by the appended claims.

In addition, the detailed description set forth below in connection with the appended drawings is intended as a description of exemplary embodiments of the present disclosure and is not intended to represent the only exemplary embodiments in which the present disclosure may be practiced. The term "exemplary" used throughout this description means "serving as an example, instance, or illustration," and should not necessarily be construed as preferred or advantageous over other exemplary embodiments.

Further, combinations such as "at least one of A, B, or C," "at least one of A, B, and C," and "at least A or B or C or a combination thereof" include any combination of A, B, and/or C, and may include multiples of A, multiples of B, or multiples of C. Specifically, combinations such as "at least A or B or C or a combination thereof," "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C.

Figure 1:
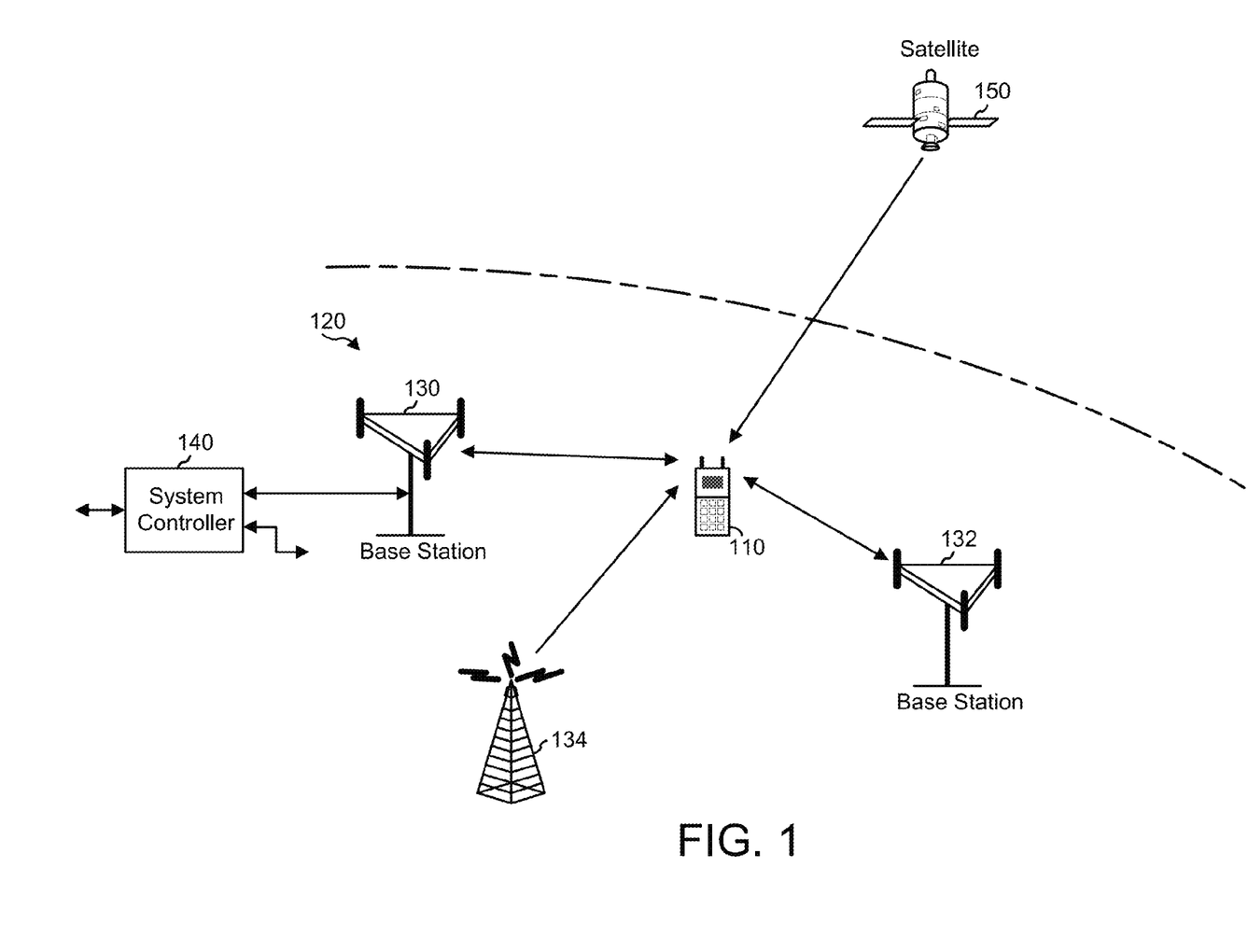
FIG. 1 shows a wireless device communicating with a wireless communication system, in accordance with some exemplary embodiments.

FIG. 1 shows a wireless device 110 communicating with a wireless communication system 120, in accordance with some exemplary embodiments. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Figure 2:
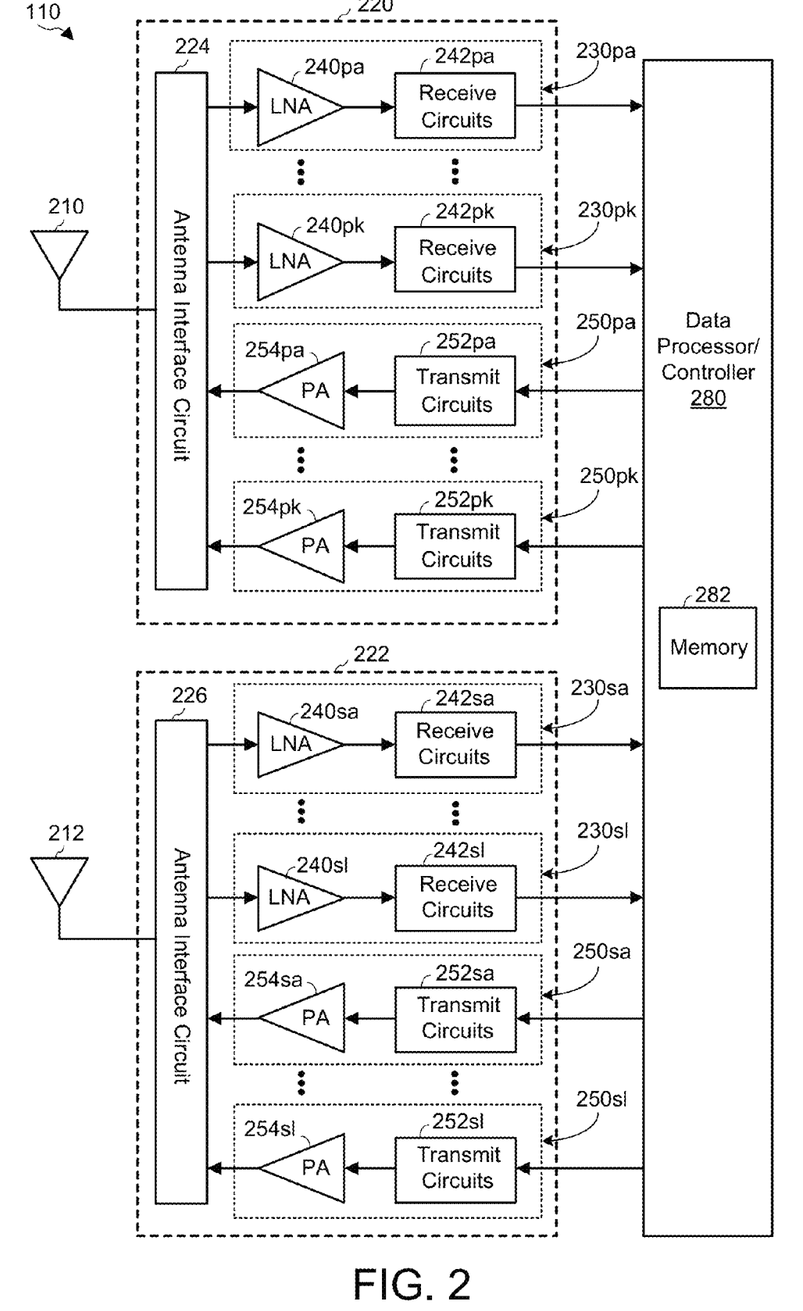
FIG. 2 shows an exemplary design of a receiver and a transmitter of FIG. 1.

FIG. 2 shows a block diagram of an exemplary design of wireless device 110 in FIG. 1. In this exemplary design, wireless device 110 includes a primary transceiver 220 coupled to a primary antenna 210, a secondary transceiver 222 coupled to a secondary antenna 212, and a data processor/controller 280. Primary transceiver 220 includes a number (K) of receivers 230pa to 230pk and a number (K) of transmitters 250pa to 250pk to support multiple frequency bands, multiple radio technologies, carrier aggregation, etc. Secondary transceiver 222 includes a number (L) of receivers 230sa to 230sl and a number (L) of transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes a low noise amplifier (LNA) 240 and receive circuits 242. For data reception, primary antenna 210 receives signals from base stations and/or other transmitter stations and provides a received radio frequency (RF) signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor/controller 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor/controller 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via primary antenna 210. Each remaining transmitter 250 in transceivers 220 and 222 may operate in similar manner as transmitter 250pa.

Each receiver 230 and transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips, as described below. The circuits in transceivers 220 and 222 may also be implemented in other manners.

Data processor/controller 280 may perform various functions for wireless device 110. For example, data processor/controller 280 may perform processing for data being received via receivers 230 and data being transmitted via transmitters 250. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Figure 3:
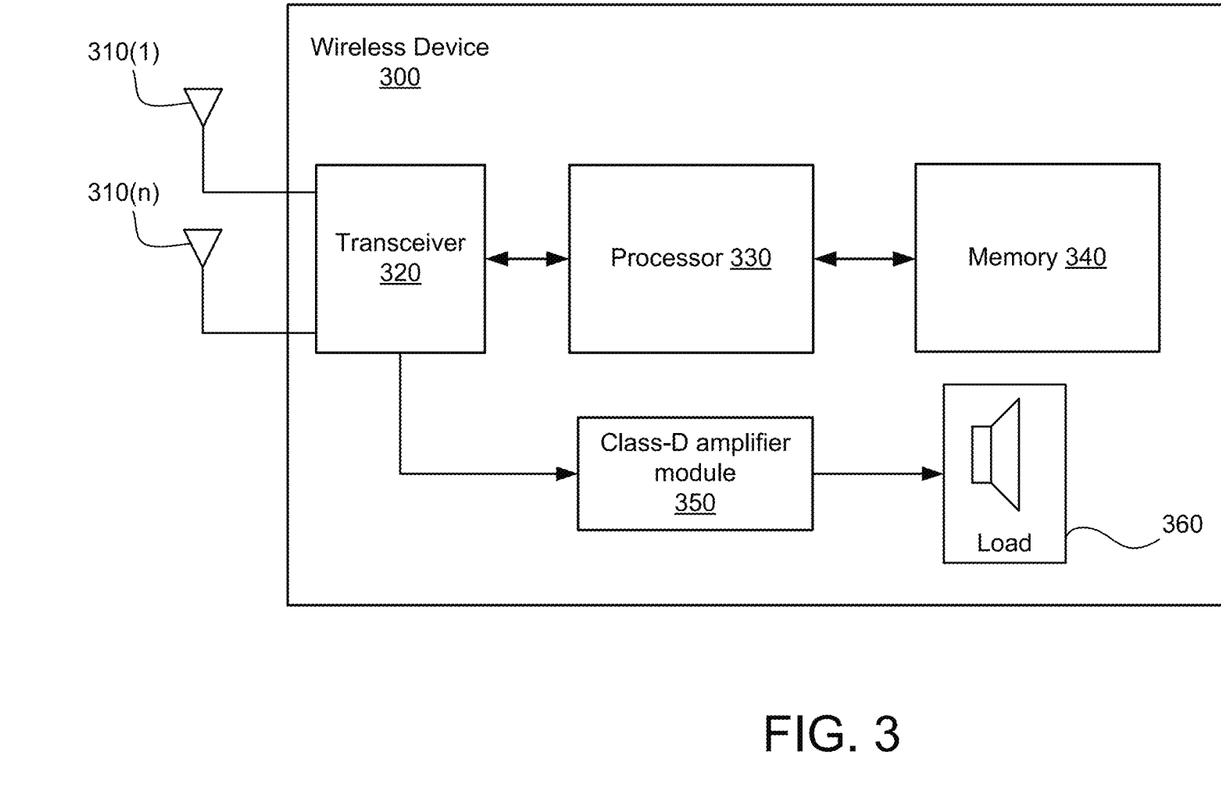
FIG. 3 shows a wireless device that is one exemplary embodiment of the wireless device of FIG. 2.

FIG. 3 shows a wireless device 300 that is one exemplary embodiment of the wireless device 110 of FIG. 2. Wireless device 300 may include a plurality of antennas 310(1)-310(n), a transceiver 320, a processor 330, a class-D amplifier module 350, a load 360, and a memory 340. Transceiver 320 may be one exemplary embodiment of primary transceiver 220 or secondary transceiver 222 of FIG. 2. Transceiver 320 may be coupled to antennas 310(1)-310(n), either directly or through an antenna selection circuit (not shown for simplicity). Transceiver 320 may be used to transmit signals and receive signals from other wireless devices. Although not shown in FIG. 3, the transceiver 320 may include any number of transmit chains to process and transmit signals to other wireless devices via antennas 310(1)-310(n), and may include any number of receive chains to process signals received from antennas 310(1)-310(n). Thus, for some exemplary embodiments, the wireless device 300 may be configured for multiple-input, multiple-output (MIMO) operations. The MIMO operations may include single-user MIMO (SU-MIMO) operations and multi-user MIMO (MU-MIMO) operations.

Memory 340, coupled to processor 330, may include a non-transitory computer-readable storage medium (e.g., one or more nonvolatile memory elements, such as EPROM, EEPROM, Flash memory, a hard drive, etc.) that may store software modules to control transceiver 320 and/or class-D amplifier module 350. For example, processor 330 may execute a software module that causes class-D amplifier module 350 to amplify a signal received from transceiver 320 and may provide the amplified signal to load 360. In some exemplary embodiments, load 360 may be speaker, for example, when the amplified signal is an audio signal. In other exemplary embodiments, load 360 may be any technically feasible load to receive an amplified signal from class-D amplifier module 350.

Figure 4:
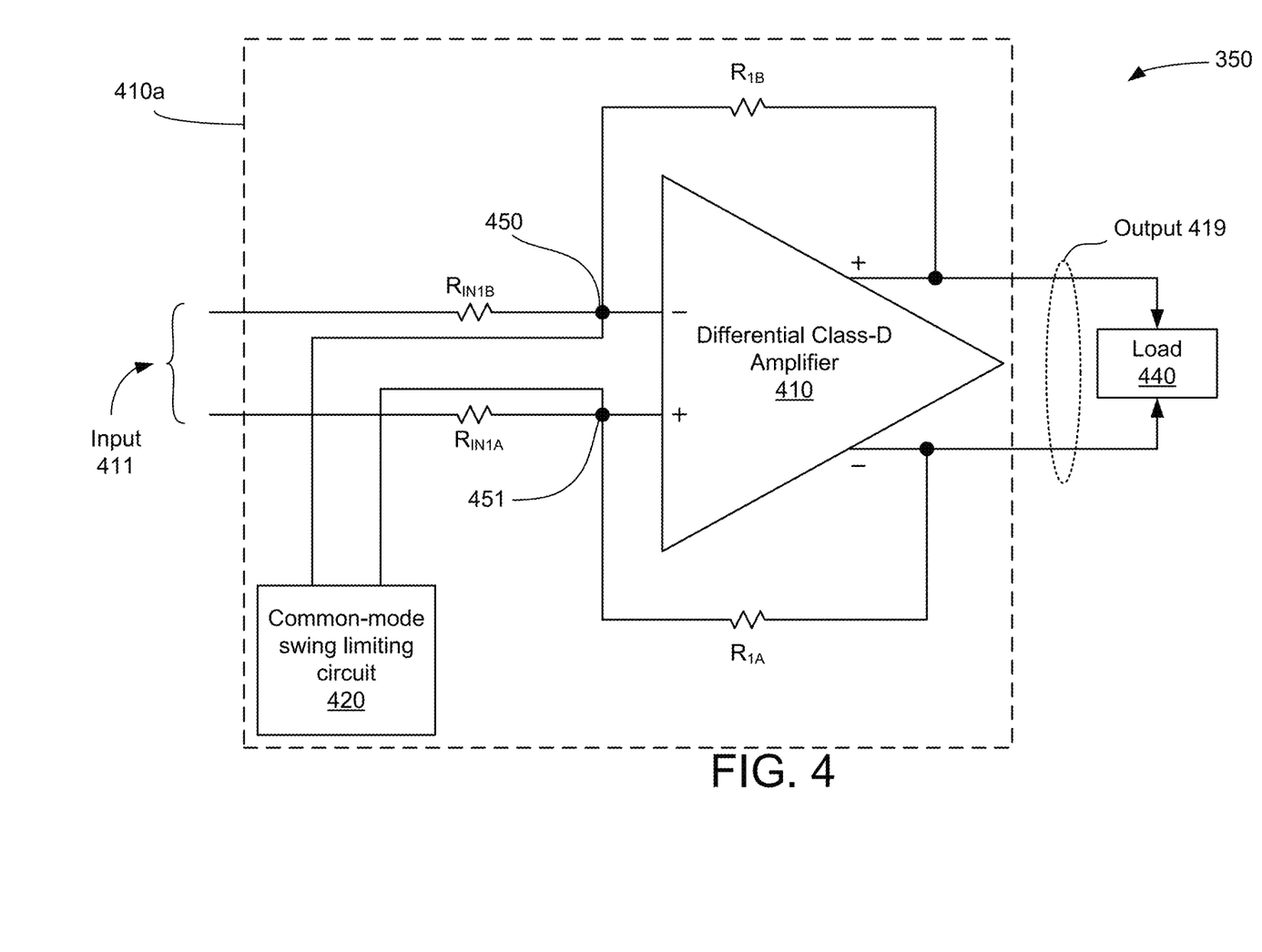
FIG. 4 is a block diagram of one exemplary embodiment of a class-D amplifier module.

FIG. 4 is a block diagram of one exemplary embodiment of class-D amplifier module 350 of FIG. 3. Class-D amplifier module 350 may include a differential class-D amplifier 410 and a common-mode swing limiting circuit 420. Differential class-D amplifier 410 may receive differential input signals 411 and may generate differential PWM output signals 419 (e.g., differential PWM signals forming a differential PWM signal pair). Although illustrated in FIG. 4 as a single stage, in other exemplary embodiments, differential class-D amplifier 410 may include a plurality of gain and/or integration and gain stages (not shown here for simplicity).

Differential input signals 411 may be provided to differential class-D amplifier 410 through one or more resistors. For example, a first input terminal of differential class-D amplifier 410 may be coupled to node 450, and a second input terminal of differential class-D amplifier 410 may be coupled to node 451. A first resistor $R_{IN1B}$, coupled to node 450, may provide a first differential input signal (from differential input signals 411) to node 450. In a similar manner, a second resistor $R_{IN1A}$, coupled to node 451, may provide a second differential input signal (from differential input signals 411) to node 451. First resistor $R_{IN1B}$ and second resistor $R_{IN1A}$ may operate as input resistors for differential class-D amplifier 410. In some exemplary embodiments, resistance values for the first resistor $R_{IN1B}$ and the second resistor $R_{IN1B}$ may be substantially similar. For example, in some exemplary embodiments, a resistance value of first and second resistors $R_{IN1B}$ and $R_{IN1A}$ may be 18,000 (18K) ohms. In other exemplary embodiments, resistance values for the first and second resistors $R_{IN1B}$ and $R_{IN1A}$ may be different values (e.g., a value other than 18K ohms) and/or may be different from each other.

At least a portion of differential PWM output signals 419 may be fed back to input terminals of differential class-D amplifier 410 (e.g., the differential PWM output signals may be partially fed back to input terminals). In some exemplary embodiments, a first resistor $R_{1A}$ and a second resistor $R_{1B}$ may be coupled between output and input terminals of differential class-D amplifier 410 to provide a feedback circuit path. Similar to resistors $R_{IN1B}$ and $R_{IN1A}$ described above, resistance values for a first resistor $R_{1A}$ and a second resistor $R_{1B}$ may be substantially similar. For example, in some exemplary embodiments, a resistance value of first and second resistors $R_{1A}$ and $R_{1B}$ may be 15K ohms. In other exemplary embodiments, first and second resistors $R_{1A}$ and $R_{1B}$ may be variable resistors having resistance values between 15K-200K ohms (variable resistors not shown for simplicity).

The differential PWM output signals 419 may be provided to a load 440. Load 440 may be another exemplary embodiment of load 360 of FIG. 3. Load 440 may be a resistive, inductive, and/or capacitive load. In some exemplary embodiments, load 440 may operate to low-pass filter the differential PWM output signals 419. One example of load 440 may be a speaker within or otherwise associated with wireless device 110.

Common-mode swing limiting circuit 420 may be coupled to the input terminals of the differential class-D amplifier 410 through nodes 450 and 451. In some exemplary embodiments, the common-mode swing limiting circuit 420 may limit a common-mode voltage swing associated with nodes 450 and 451 by providing a relatively low impedance circuit path to a reference voltage (e.g., ground) for common-mode signals. In some exemplary embodiments, the common-mode signals may be associated with one or more common-mode signal components of the differential PWM output signals 419.

In some exemplary embodiments, a differential class-D amplifier 410a (shown with dashed lines) may include differential class-D amplifier 410, common-mode swing limiting circuit 420, resistors $R_{IN1A}$, $R_{IN1B}$, $R_{1A}$, and $R_{1B}$. In some other exemplary embodiments, the common-mode swing limiting circuit 420 may provide a relatively high-impedance circuit path to a reference voltage for differential signals. The differential signals may be associated with one or more differential signal components of the differential PWM output signals 419. Operation of differential class-D amplifier 410 and common-mode swing limiting circuit 420 is described in more detail below in conjunction with FIG. 5.

Figure 5:
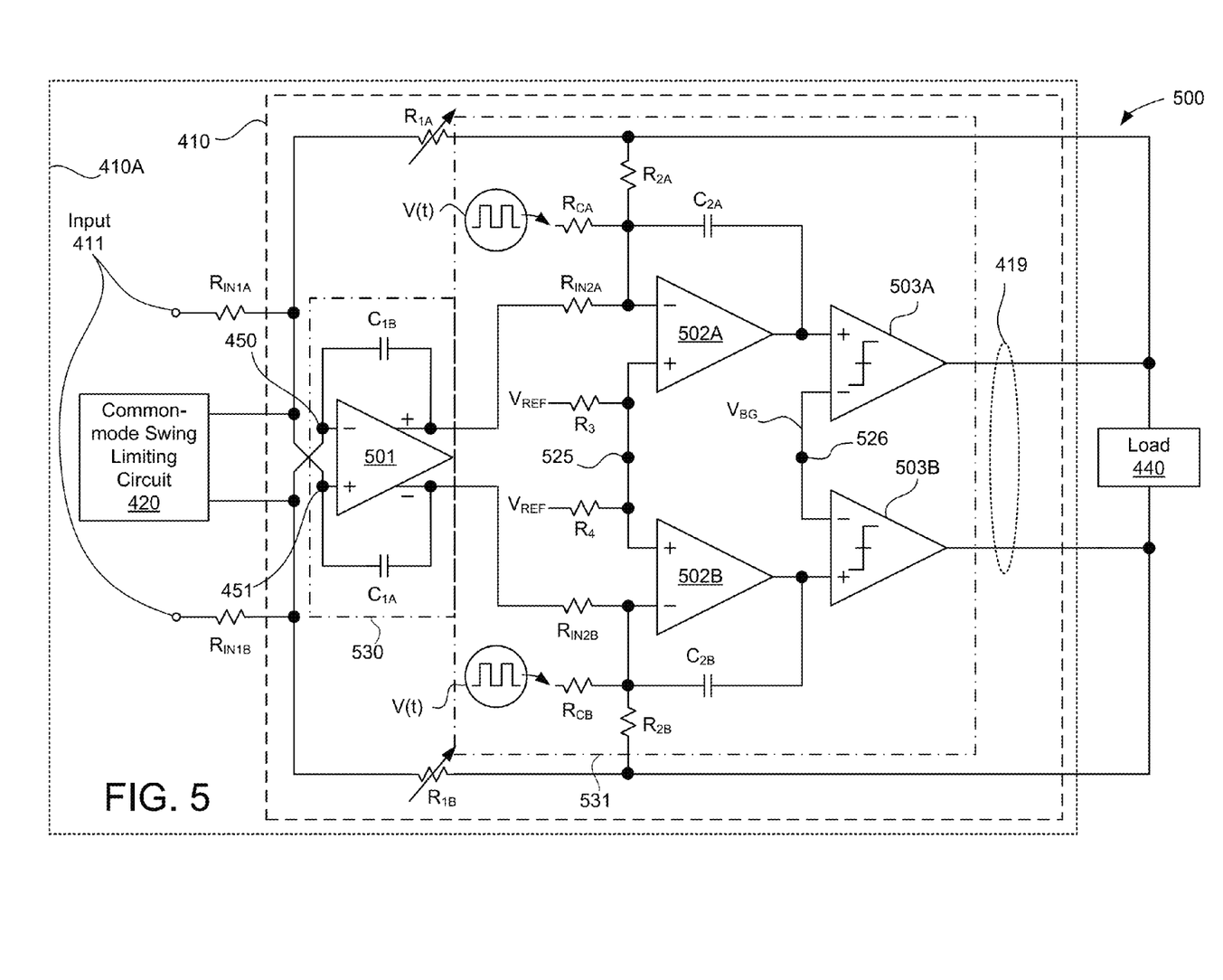
FIG. 5 is an exemplary circuit diagram of the differential class-D amplifier and the common-mode swing limiting circuit of FIG. 4, in accordance with some exemplary embodiments

FIG. 5 is an exemplary circuit diagram 500 of the differential class-D amplifier 410 (shown within dashed lines) and the common-mode swing limiting circuit 420 of FIG. 4, in accordance with some exemplary embodiments. In other exemplary embodiments, the differential class-D amplifier 410A (shown with dotted lines) may include the differential class-D amplifier 410 and the common-mode swing limiting circuit 420. The differential class-D amplifier 410 may receive differential input signals 411 and may generate differential PWM output signals 419. The differential PWM output signals 419 may be provided to load 440. The common-mode swing limiting circuit 420 may be coupled to input terminals of differential class-D amplifier 410 through nodes 450 and 451. In the discussion below, multiple instances of electrical elements are noted. Similarly named electrical elements may have similar values. For example, resistors similarly denoted as $R_X$ may have substantially similar resistive values.

The differential class-D amplifier 410 may include a first differential amplifier 501, second differential amplifiers 502A and 502B, and comparators 503A and 503B. In some exemplary embodiments, differential class-D amplifier 410 may include a first integration and gain stage 530 and a second integration and gain stage 531. First integration and gain stage 530 may include first differential amplifier 501 and second integration and gain stage may include second differential amplifiers 502A and 502B and comparators 503A and 503B.

Differential input signals 411 may be provided through input resistors $R_{IN1A}$ and $R_{IN1B}$ to first differential amplifier 501. Capacitors $C_{1A}$ and $C_{1B}$ may couple output terminals to input terminals of first differential amplifier 501. In some exemplary embodiments, first differential amplifier 501 may integrate differential input signals 411 via a time-dependent behavior based on capacitors $C_{1A}$ and $C_{1B}$ and input resistors $R_{1A}$ and $R_{1B}$.

Output signals from first differential amplifier 501 may be provided to second differential amplifiers 502A and 502B via resistors $R_{IN2A}$ and $R_{IN2B}$. Capacitors $C_{2A}$ and $C_{2B}$ may couple output terminals to input terminals of the second differential amplifiers 502A and 502B, as depicted in FIG. 5. In some exemplary embodiments, the second differential amplifiers 502A and 502B may integrate signals at their respective input terminals via a time-dependent behavior based on capacitors $C_{2A}$ and $C_{2B}$ and input resistors $R_{IN2A}$ and $R_{IN2B}$, respectively.

Signal generators may provide a periodic square wave signal and may also be coupled to input terminals of the second differential amplifiers 502A and 502B. As the periodic square wave signals are integrated (based on the capacitors $C_{2A}$ and $C_{2B}$ and the resistors $R_{IN2A}$ and $R_{IN2B}$), the resulting triangle wave signals may be used to determine output signals for the second differential amplifiers 502A and 502B. In some exemplary embodiments, the triangle wave signals may be used to determine differential PWM output signals 419 provided by comparators 503A and 503B. As shown, a periodic square wave signal (denoted as V(t) in FIG. 5) may be provided to an inverting input (e.g., a first differential input terminal) of second differential amplifier 502A through resistor $R_{CA}$. In a similar manner, the periodic square wave signal V(t) may be provided to an inverting input of second differential amplifier 502B through resistor $R_{CB}$.

In some exemplary embodiments, a non-inverting input of second differential amplifiers 502A and 502B may be coupled to a reference voltage. For example, the non-inverting inputs (e.g., a second differential input terminal) of second differential amplifiers 502A and 502B may be coupled together through node 525. In addition, a reference voltage $V_{REF}$ may be provided to node 525 through a resistor $R_3$ and a resistor $R_4$. In some exemplary embodiments, $V_{REF}$ may be VDD/2, where VDD is a power supply voltage for differential class-D amplifier 410. In other exemplary embodiments, other reference voltages may be used as $V_{REF}$. Node 526 may be coupled to a band-gap voltage reference providing a band-gap voltage $V_{BG}$ (band-gap voltage reference source not shown for simplicity). Thus, resistors $R_3$, $R_4$, and $R_{IN2}$ may couple node 525 (and therefore non-inverting inputs of second differential amplifiers 502A and 502B) to a voltage determined by resistor values of resistors $R_3$, $R_4$, and $R_{IN2}$, and voltages $V_{REF}$ and $V_{BG}$.

Output signals from second differential amplifiers 502A and 502B may be provided to non-inverting inputs of comparators 503A and 503B, respectively. The inverting inputs of the comparators 503A and 503B may be coupled to the band-gap voltage $V_{BG}$ at node 526. The comparators 503A and 503B may generate the differential PWM output signals 419 for the differential class-D amplifier 410. In some exemplary embodiments, the comparators 503A and 503B may include switching transistors to drive the differential PWM output signals 419. For example, comparators 503A and 503B may include one or more switching transistors associated with one or more H-bridge structures. As shown, the differential PWM output signals 419 may be provided to load 440.

In some exemplary embodiments, differential PWM output signals 419 may be provided (fed back) to the inverting input terminals of the second differential amplifiers 502A and 502B through resistors $R_{2A}$ and $R_{2B}$. In a similar manner, differential PWM output signals 419 may be provided to the input terminals of first differential amplifier through resistors $R_{1A}$ and $R_{1B}$. As shown, a first differential PWM output signal (from differential PWM output signals 419) may be coupled through resistor $R_{1B}$ to node 450 and a second differential PWM output signal (also from differential PWM output signals 419) may be coupled through resistor $R_{1A}$ to node 451. In some exemplary embodiments, resistors $R_{1A}$ and $R_{1B}$ may be variable resistors that may provide a varying resistance value and may enable varying amounts of the differential PWM output signals 419 to be coupled to first differential amplifier 501. For example, resistors $R_{1A}$ and $R_{1B}$ may have a resistance value of between 15K to 200K ohms.

Common-mode swing limiting circuit 420 may also be coupled to the inputs of the differential class-D amplifier 410 through nodes 450 and 451. Common-mode swing limiting circuit 420 may limit common-mode voltage swings that may result from differential PWM output signals 419 provided through resistors $R_{1A}$ and $R_{1B}$. Operation of common-mode swing limiting circuit 420 is described in more detail below in conjunction with FIGS. 6-8.

Figure 6:
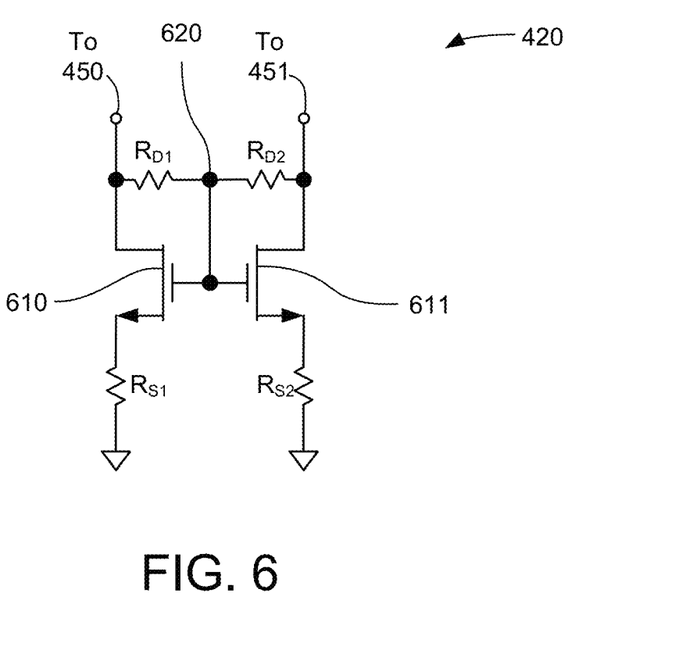
FIG. 6 is a circuit diagram of an exemplary embodiment of the common-mode swing limiting circuit of FIG. 5.

FIG. 6 is a circuit diagram of an exemplary embodiment of common-mode swing limiting circuit 420 of FIG. 5. The exemplary embodiment of common-mode swing limiting circuit 420, as depicted in FIG. 6, may include a first field effect transistor (FET) 610 and a second FET 611. In some exemplary embodiments, first FET 610 and second FET 611 may be NMOS transistors. In other exemplary embodiments, first FET 610 and second FET 611 may be PMOS transistors, NPN transistors, PNP transistors or any other suitable devices. In some exemplary embodiments, source terminals of first FET 610 and second FET 611 may be coupled to ground through resistors. In other exemplary embodiments, first FET 610 and second FET 611 may be coupled to other technically feasible reference voltages. For example, if first FET 610 and second FET 611 are PMOS transistors, then first FET 610 and second FET 611 may be coupled to a supply voltage (e.g., VDD) instead of ground. In some exemplary embodiments, resistor $R_{S1}$ may couple a source terminal of FET 610 to ground, and resistor $R_{S2}$ may couple a source terminal of FET 611 to ground. In some exemplary embodiments, resistors $R_{S1}$ and $R_{S2}$ may have a resistive value of approximately 18K ohms. In other exemplary embodiments, resistors $R_{S1}$ and $R_{S2}$ may have other resistive values and/or resistive values different from each other.

A resistor $R_{D1}$ may be coupled between a drain terminal and a gate terminal of first FET 610. In a similar manner, a resistor $R_{D2}$ may be coupled between a drain terminal and a gate terminal of second FET 611. In addition, the gate terminal of first FET 610 may be coupled to the gate terminal of second FET 611 through a common node 620. The drain terminal of first FET 610 may be coupled to node 450, and the drain terminal of second FET 611 may be coupled to node 451.

In some exemplary embodiments, differential PWM output signals 419 (fed back to inputs of differential class-D amplifier 410) may include one or more common-mode signal components and one or more differential signal components. The common-mode signal components may drive nodes 450 and 451 together at substantially similar voltage levels. Thus, a voltage at node 450 may be substantially similar to a voltage at node 451. As a common-mode voltage (due to one or more common-mode signal components) increases voltage levels at both nodes 450 and 451, first FETs 610 and second FETs 611 begin to conduct and provide a low impedance circuit path to ground. Operation of common-mode swing limiting circuit 420 with respect to common-mode signal components is described in more detail below in conjunction with FIG. 7.

In some exemplary embodiments, the differential PWM output signals 419 may include one or more differential signal components. The differential signal components may increase a voltage at node 450 while decreasing a voltage at node 451 (or vice versa). Since a differential signal (due to one or more differential signal components) may assert equal, but opposite voltages at node 450 and node 451, common node 620 may operate as a virtual ground enabling resistors $R_{D1}$ and $R_{D2}$ to couple nodes 450 and 451 to ground. Operation of common-mode swing limiting circuit 420 with respect to differential signal components is described in more detail below in conjunction with FIG. 8.

Those skilled in the art will appreciate that common-mode swing limiting circuit 420 may be implemented with devices that operate in a manner complementary to NMOS FETs described above. For example, when first FET 610 and second FET 611 are PMOS FETs, then the associated source terminals may be coupled to a positive voltage (e.g., a supply voltage) through resistors $R_{S1}$ and $R_{S2}$. Furthermore, common-mode signal components at nodes 450 and 451 may be coupled to the positive voltage through a low impedance circuit path.

Figure 7:
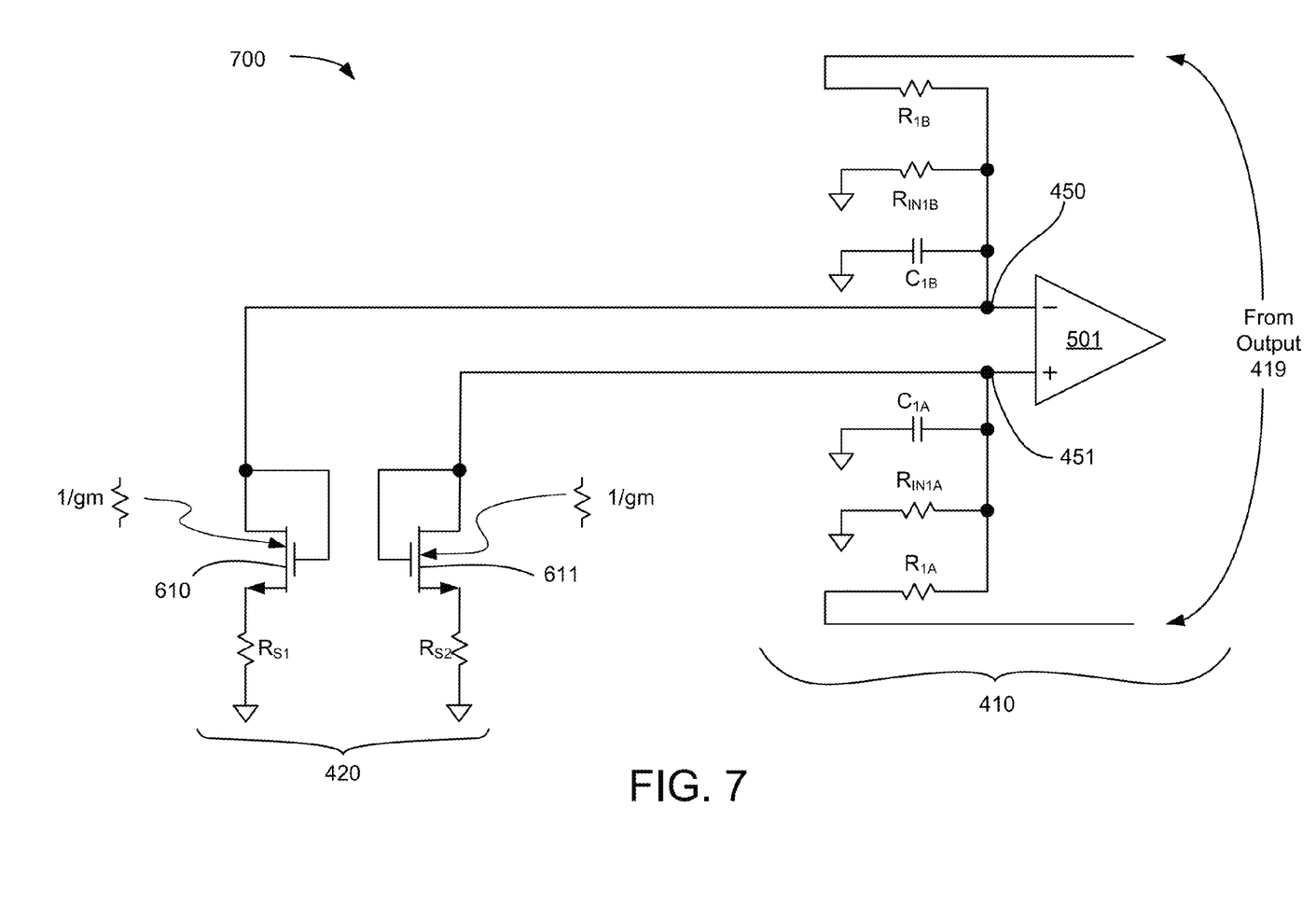
FIG. 7 is a simplified equivalent circuit diagram of a differential class-D amplifier and a common-mode swing limiting circuit operating on one or more common-mode signal components, in accordance with exemplary embodiments.

FIG. 7 is a simplified equivalent circuit diagram 700 of differential class-D amplifier 410 and common-mode swing limiting circuit 420 operating on one or more common-mode signal components, in accordance with exemplary embodiments. Equivalent circuit diagram 700 may show equivalent circuit elements and related configurations associated with the one or more common-mode signal components (e.g., common-mode signals) associated with nodes 450 and 451. As shown, common-mode swing limiting circuit 420 is coupled to differential class-D amplifier 410 through nodes 450 and 451. For simplicity, only a portion of differential class-D amplifier 410 is shown in FIG. 7. Portions of differential class-D amplifier 410 that are omitted may have negligible or no effect on common-mode signal components at nodes 450 and 451. Common-mode swing limiting circuit 420 is shown to include first FET 610, second FET 611, first source resistor $R_{S1}$, and second source resistor $R_{S2}$; however, resistors $R_{D1}$ and $R_{D2}$ (see FIG. 6) may be omitted since when common-mode signals are coupled to nodes 450 and 451, no current may flow across resistors $R_{D1}$ and $R_{D2}$. Furthermore, configurations of capacitors $C_{1A}$ and $C_{1B}$, resistors $R_{1A}$-$R_{1B}$ and $R_{IN1A}$-$R_{IN1B}$ of differential class-D amplifier 410 are shown with respect to common-mode signal components of differential PWM output signals 419 coupled to nodes 450 and 451.

As the common-mode signal component of differential PWM output signals 419 is received through resistors $R_{1A}$-$R_{1B}$, nodes 450 and 451 increase in voltage potential and cause first FET 610 and second FET 611 to conduct. When first FET 610 and second FET 611 conduct, the associated FETs may be replaced (for analysis) with an equivalent resistance. The equivalent resistance may be based on a transconductance of the related FET. In some exemplary embodiments, the equivalent resistance (e.g. an equivalent resistance value) may be 1/gm, where gm is the transconductance of the associated FET. Thus, first FET 610 may form, at least in part, a first resistive circuit path having a resistance value of 1/(gm of first FET 610). In a similar manner, second FET 611 may form, at least in part, a second resistive circuit path having a resistance value of 1/(gm of second FET 611). In some exemplary embodiments, first FET 610 may be substantially similar to second FET 610 (e.g., have similar physical and/or electrical characteristics). When first FET 610 is substantially similar to second FET 611, the transconductance of first FET 610 may be substantially similar to the transconductance of second FET 611.

Common-mode signal components of differential PWM output signal 419 are coupled (e.g., directed) to first differential amplifier 501 through a first voltage divider including impedances associated with $R_{1A}$, $R_{IN1A}$, $C_{1A}$, and equivalent resistance 1/gm and through a second voltage divider including impedances associated with $R_{1B}$, $R_{IN1B}$, $C_{1B}$, and equivalent resistance 1/gm. For example, voltage at node 450 and node 451 may be expressed by equation 1, shown below:

$$V_{node} = V_{OUT} * \frac{R_{IN1}\|C_1\|1/gm}{R_1 + (R_{IN1}\|C_1\|1/gm)} \quad \text{(eq. 1)}$$

Where:
$R_{IN1}$ is $R_{IN1A}$ or $R_{IN1B}$;
$R_1$ is $R_{1A}$ or $R_{1B}$;
$C_1$ is $C_{1A}$ or $C_{1B}$;
$V_{OUT}$ is a common-mode signal component from differential PWM output signals 419; and
$V_{NODE}$ is a voltage at node 450 and/or 451.

As an approximation, as transconductance (gm) increases, the associated equivalent resistance 1/gm decreases, and the voltage divider simplifies to $1/R_1$ (e.g., $1/R_{1A}$ or $1/R_{1B}$). Thus, although common-mode signal components from differential PWM output signals 419 are coupled (e.g., directed) to first differential amplifier 501, the coupling is limited to a $1/R_1$ multiplying factor provided by the voltage divider. For example, if $R_1$ is approximately 15K ohms, then common mode signal components are coupled to first differential amplifier through a 1/15K, or approximately a 0.00006 multiplying factor.

Figure 8:
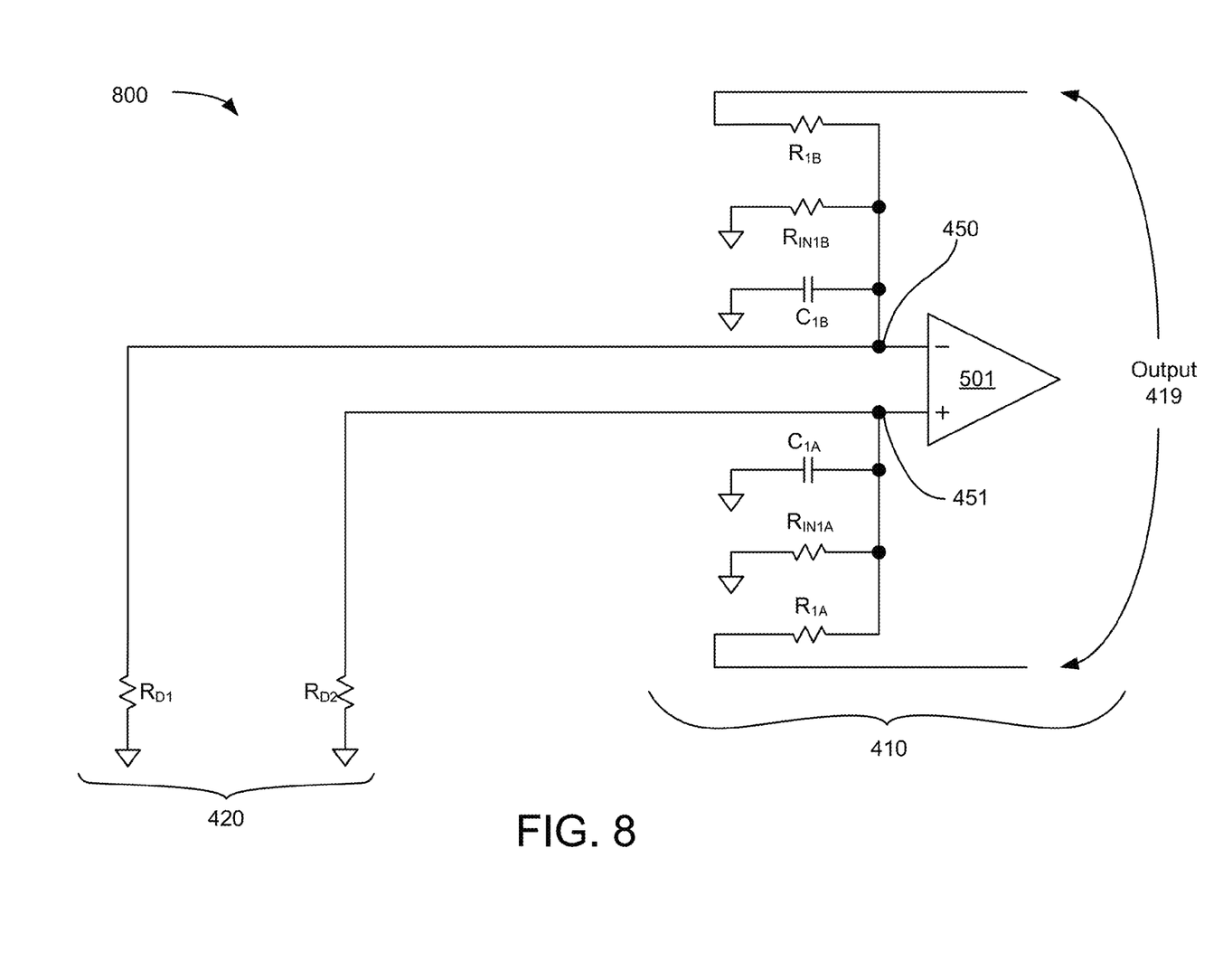
FIG. 8 is a simplified equivalent circuit diagram of another differential class-D amplifier and common-mode swing limiting circuit operating on one or more differential signal components, in accordance with exemplary embodiments.

FIG. 8 is a simplified equivalent circuit diagram 800 of differential class-D amplifier 410 and common-mode swing limiting circuit 420 operating on one or more differential signal components, in accordance with exemplary embodiments. Equivalent circuit diagram 800 may show equivalent circuit elements and related configurations associated with the one or more differential signal components associated with nodes 450 and 451.

As shown, common-mode swing limiting circuit 420, coupled to nodes 450 and 451, may be simplified to resistors $R_{D1}$ and $R_{D2}$ for differential signal components. Common-mode swing limiting circuit 420 may be coupled to differential class-D amplifier 410 through nodes 450 and 451. For simplicity, only a portion of differential class-D amplifier 410 is shown in FIG. 8. Portions of differential class-D amplifier 410 that are omitted may have negligible or no effect on differential signal components at nodes 450 and 451. Referring also to FIG. 6, as a differential signal is provided to nodes 450 and 451, common node 620 may operate as a virtual ground. In some exemplary embodiments, node 620 may operate as any technically feasible reference voltage. Thus, in FIG. 8, differential signal components of differential PWM output signals 419 may be coupled (e.g., directed) to first differential amplifier 501 through a first voltage divider including impedances associated with $R_{1A}$, $R_{IN1A}$, $C_{1A}$, and $R_{D2}$, and through a second voltage divider including impedances associated with $R_{1B}$, $R_{IN1B}$, $C_{1A}$, and $R_{D1}$. In some exemplary embodiments, a resistance value of $R_{D1}$ may be substantially similar to $R_{D2}$. Voltage at node 450 and node 451 may be expressed by equation 2, shown below:

$$V_{node} = V_{OUT} * \frac{R_{IN1} \| C_1 \| R_D}{R_1 + (R_{IN1} \| C_1 \| R_D)} \qquad (eq.\ 2)$$

Where:

$R_{IN1}$ is $R_{IN1A}$ or $R_{IN1B}$;

$R_1$ is $R_{1A}$ or $R_{1B}$;

$R_D$ is $R_{D1}$ or $R_{D2}$;

$C_1$ is $C_{1A}$ or $C_{1B}$;

$V_{OUT}$ is the differential signal component from differential PWM output signals 419; and $V_{NODE}$ is a voltage at node 450 and/or 451.

If $R_D$ is $\gg R_{IN1}$ and $C_1$, then $R_D$ can be removed from equation 2 yielding equation 3, shown below:

$$V_{node} = V_{OUT} * \frac{R_{IN1} \| C_1}{R_1 + (R_{IN1} \| C_1)} \qquad (eq.\ 3)$$

In some exemplary embodiments, $R_D$ may be 400,000 (400K) ohms, $R_{IN1}$ may be 18K ohms, and $R_1$ may be 15K ohms (e.g., where $R_{IN1}$ may denote resistors $R_{IN1A}$ and $R_{IN1B}$, and resistor $R_1$ may denote resistors $R_{1A}$ and $R_{1B}$). Thus, $R_D$ may have little or no effect on differential signals.

Figure 9:
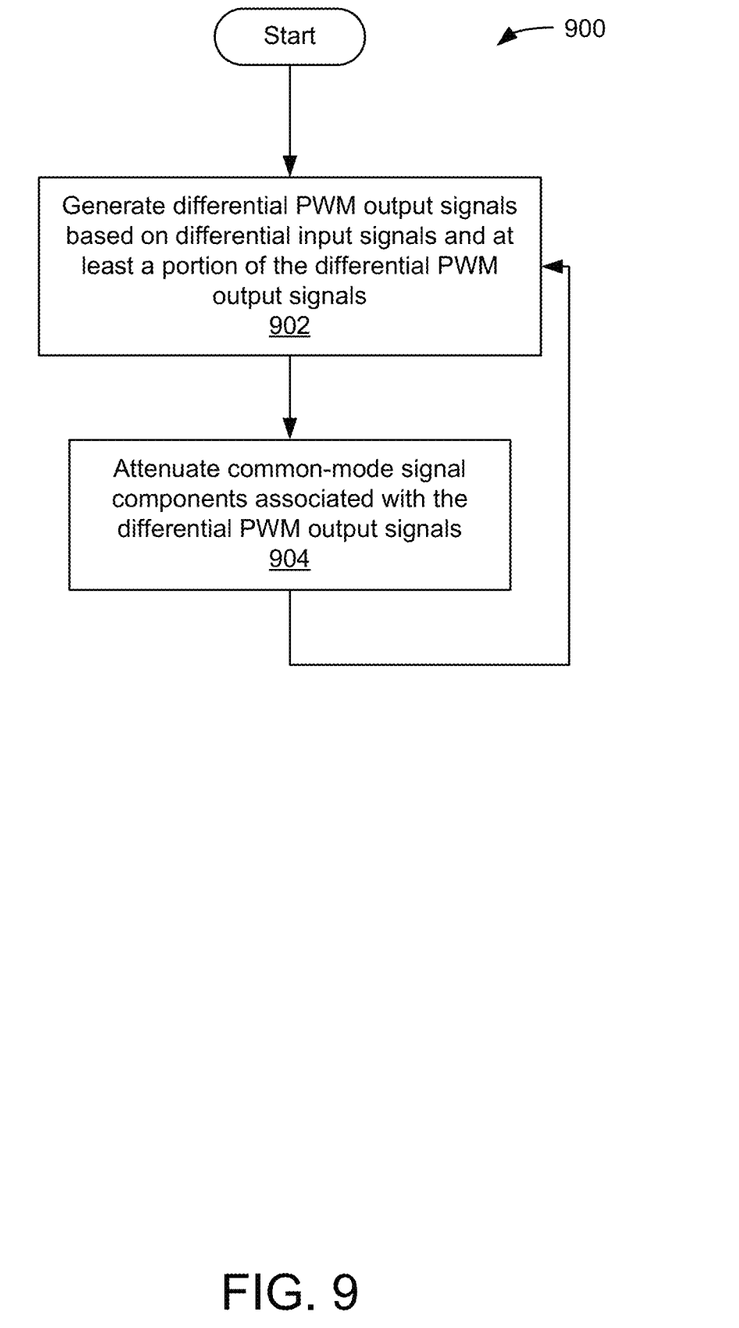
FIG. 9 shows an illustrative flow chart depicting an exemplary operation for the class-D amplifier module of FIG. 4, in accordance with some exemplary embodiments.

FIG. 9 shows an illustrative flow chart depicting an exemplary operation 900 for class-D amplifier module 350 of FIG. 4, in accordance with some exemplary embodiments. Some exemplary embodiments may perform the operations described herein with additional operations, fewer operations, operations in a different order, operations in parallel, and/or some operations differently. Referring also to FIGS. 5 and 6, differential class-D amplifier 410 generates differential PWM output signals 419 (902). In some exemplary embodiments, the differential PWM output signals 419 may be based on differential input signals 411 coupled to differential class-D amplifier 410 and at least a portion of the differential PWM output signals 419 that may be fed back to differential class-D amplifier 410. For example, a portion of differential PWM output signals 419 may be fed back through feedback resistors $R_{1A}$ and $R_{1B}$.

Next, common-mode signal components associated with differential PWM output signals 419 may be attenuated (904). In some exemplary embodiments, an amplitude and/or a phase associated with the common-mode signal components may be attenuated (e.g., reduced in magnitude and/or phase) by common-mode swing limiting circuit 420. For example, the common-mode swing limiting circuit 420 may include a plurality of transistors to couple (e.g., direct) common-mode signal components to ground (or any other technically feasible reference voltage) through resistive circuit paths based on a transconductance associated with the plurality of transistors. In other exemplary embodiments, common-mode swing limiting circuit 420 may include a plurality of resistors to couple differential signal components associated with the PWM output signals 419 to a common node.

Operations may proceed to 902 to enable continuous monitoring and attenuating of the common-mode signal components associated with the differential PWM output signals 419.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media.

In the foregoing specification, the exemplary embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An apparatus comprising:
   a first circuit configured to generate differential pulse width modulated (PWM) signals, the first circuit comprising:
   a first feedback path coupled between a first output terminal of the first circuit and a first input terminal of the first circuit; and
   a second feedback path coupled between a second output terminal of the first circuit and a second input terminal of the first circuit; and
   a second circuit, coupled to the first circuit, configured to attenuate a plurality of common-mode signal components associated with the differential PWM signals, the second circuit comprising:
   a first transconductance configured to couple the first feedback path to ground; and
   a second transconductance configured to couple the second feedback path to ground.

2. The apparatus of claim 1, the second circuit comprising:
a first resistor configured to direct a first differential signal component associated with the differential PWM signals to a reference voltage; and
a second resistor, coupled to the first resistor, configured to direct a second differential signal component associated with the differential PWM signals to the reference voltage.

3. The apparatus of claim 1, the second circuit comprising:
a first transistor configured to direct a first common-mode signal component from the plurality of common-mode signal components to a reference voltage; and
a second transistor configured to direct a second common-mode signal component from the plurality of common-mode signal components to the reference voltage.

4. The apparatus of claim 3, wherein the first transistor is configured to direct the first common-mode signal component via a first resistive circuit path, and the second transistor is configured to direct the second common-mode signal component via a second resistive circuit path.

5. The apparatus of claim 3, wherein the first transconductance is associated with the first transistor, and the second transconductance is associated with the second transistor.

6. The apparatus of claim 3, the first transistor comprising a first source terminal coupled to the reference voltage and the second transistor comprising a second source terminal coupled to the reference voltage.

7. The apparatus of claim 3, the first transistor comprising a first drain terminal configured to receive the first common-mode signal component, and the second transistor comprising a second drain terminal configured to receive the second common-mode signal component.

8. The apparatus of claim 3, wherein the first transistor and the second transistor are at least NMOS transistors or PMOS transistors or NPN transistors or PNP transistors or a combination thereof.

9. The apparatus of claim 1, the first circuit comprising:
a first stage configured to receive the differential PWM signals; and
a second stage, coupled to the first stage, the second stage configured to integrate a periodic square wave signal.

10. The apparatus of claim 9, the first circuit further comprising:
a plurality of variable resistors configured to direct the differential PWM signals to the first stage.

11. The apparatus of claim 1, the second circuit comprising:
a first impedance configured to direct a first common-mode signal component from the plurality of common-mode signal components to a reference voltage; and
a second impedance configured to direct a second common-mode signal component from the plurality of common-mode signal components to the reference voltage.

12. An apparatus comprising:
means for generating differential pulse width modulated (PWM) signals; and
means for attenuating a plurality of common-mode signal components associated with the differential PWM signals using a first transconductance to couple a first feedback path to ground and using a second transconductance to couple a second feedback path to ground.

13. The apparatus of claim 12, the means for attenuating the plurality of common-mode signal components comprising:
means for directing a first differential signal component associated with the differential PWM signals to a reference voltage; and
means for directing a second differential signal component associated with the differential PWM signals to the reference voltage.

14. The apparatus of claim 12, the means for attenuating the plurality of common-mode signal components comprising:
means for directing a first common-mode signal component from the plurality of common-mode signal components to a reference voltage; and
means for directing a second common-mode signal component from the plurality of common-mode signal components to the reference voltage.

15. The apparatus of claim 14, further comprising:
means for directing the first common-mode signal component via a first resistive circuit path to the reference voltage; and
means for directing a second common-mode signal via a second resistive circuit path to the reference voltage.

16. The apparatus of claim 15, wherein a resistance value of the first resistive circuit path is based on the first transconductance, and a resistance value of the second resistive circuit path is based on the second transconductance.

17. The apparatus of claim 14, further comprising:
means for directing the first common-mode signal component via a first resistor to the reference voltage; and
means for directing the second common-mode signal component via a second resistor to the reference voltage.

18. The apparatus of claim 12, the means for generating the differential PWM signals comprising:
means for integrating a periodic square wave signal; and
means for receiving the differential PWM signals fed back from the means for integrating a periodic square wave signal.

19. A method comprising:
generating, at a first circuit, differential pulse width modulated (PWM) signals; and
attenuating, at a second circuit, a plurality of common-mode signal components associated with the differential PWM signals using a first transconductance to couple a first feedback path to ground and using a second transconductance to couple a second feedback path to ground.

20. The method of claim 19, further comprising:
directing a first differential signal component associated with the differential PWM signals to a reference voltage; and
directing a second differential signal component associated with the differential PWM signals to the reference voltage.

* * * * *